(12) United States Patent
Pang et al.

(10) Patent No.: US 7,038,519 B1
(45) Date of Patent: May 2, 2006

(54) DIGITAL CLOCK MANAGER HAVING CASCADE VOLTAGE SWITCH LOGIC CLOCK PATHS

(75) Inventors: Raymond C. Pang, San Jose, CA (US); Jennifer Wong, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/837,324

(22) Filed: Apr. 30, 2004

(51) Int. Cl.
    *H03H 11/26* (2006.01)
(52) U.S. Cl. ...................... 327/278; 327/285
(58) Field of Classification Search ........ 327/276–278, 327/280–281, 284–285, 287–288
See application file for complete search history.

(56) References Cited

U.S. PATENT DOCUMENTS

| | | | |
|---|---|---|---|
| 5,068,628 A | 11/1991 | Ghoshal | |
| 5,374,860 A * | 12/1994 | Llewellyn | 327/276 |
| 5,465,076 A | 11/1995 | Yamauchi et al. | |
| 5,489,864 A | 2/1996 | Ashuri | |
| 5,638,030 A * | 6/1997 | Du | 331/57 |
| 5,646,564 A | 7/1997 | Erickson et al. | |
| 5,712,884 A | 1/1998 | Jeong | |
| 5,796,673 A | 8/1998 | Foss et al. | |
| 5,963,074 A | 10/1999 | Arkin | |
| 5,994,938 A * | 11/1999 | Lesmeister | 327/277 |
| 6,043,717 A | 3/2000 | Kurd | |
| 6,104,223 A | 8/2000 | Chapman et al. | |
| 6,125,157 A | 9/2000 | Donnelly et al. | |
| 6,151,356 A | 11/2000 | Spagnoletti et al. | |
| 6,184,753 B1 | 2/2001 | Ishimi et al. | |
| 6,194,930 B1 | 2/2001 | Matsuzaki et al. | |
| 6,211,722 B1 * | 4/2001 | Mattia et al. | 327/407 |
| 6,289,068 B1 | 9/2001 | Hassoun et al. | |
| 6,292,040 B1 | 9/2001 | Iwamoto et al. | |
| 6,400,180 B1 | 6/2002 | Wittig et al. | |
| 6,400,735 B1 | 6/2002 | Percey | |
| 6,492,851 B1 * | 12/2002 | Watarai | 327/158 |
| 6,501,309 B1 | 12/2002 | Tomita | |
| 6,518,812 B1 * | 2/2003 | Sikkink et al. | 327/284 |
| 6,621,358 B1 * | 9/2003 | Carballo et al. | 331/57 |
| 6,642,771 B1 * | 11/2003 | Smetana | 327/411 |
| 6,847,246 B1 * | 1/2005 | Kaviani et al. | 327/276 |

FOREIGN PATENT DOCUMENTS

| | | |
|---|---|---|
| EP | 0655840 A2 | 11/1994 |
| EP | 0704975 A1 | 4/1996 |
| JP | 5-191233 | 7/1993 |

(Continued)

OTHER PUBLICATIONS

U.S. Appl. No. 10/792,055, filed Mar. 2, 2004, Lu.

(Continued)

*Primary Examiner*—Kenneth B. Wells
*Assistant Examiner*—Cassandra Cox
(74) *Attorney, Agent, or Firm*—E. Eric Hoffman; Justin Liu (57) ABSTRACT

A digital clock manager having differential clock signal paths is provided. The differential clock signal paths are provided by replacing single-ended circuit elements of a conventional digital clock manager with symmetrical cascade voltage switch logic (CVSL) circuit elements, including CVSL delay buffers, CVSL multiplexers, CVSL AND gates, CVSL OR gates and CVSL set-reset latches. These symmetrical CVSL AND gates, CVSL OR gates and CVSL set-reset latches represent new circuit elements.

11 Claims, 6 Drawing Sheets

FOREIGN PATENT DOCUMENTS

| | | |
|---|---|---|
| WO | WO97/40576 | 10/1997 |
| WO | WO99/14759 | 3/1999 |
| WO | WO 99/67882 | 12/1999 |

OTHER PUBLICATIONS

U.S. Appl. No. 10/618,404, filed Jul. 11, 2003, Young.
U.S. Appl. No. 10/837,210, filed Apr. 30, 2004, Percey, et al.
U.S. Appl. No. 10/837,186, filed Apr. 30, 2004, Morrison et al.
U.S. Appl. No. 10/837,059, filed Apr. 30, 2004, Logue et al.
U.S. Appl. No. 10/683,944, filed Oct. 1, 2003, Young.
Microelectronics Group, Lucent Technologies, Inc., Preliminary Data Sheet, May 1998, ORCA OR3Cxx (5 V), and OR3Txxx (3.3 V) Series Field-Programmable Gate Arrays, pp. 3, 69-80, available from Microelectronics Group, Lucent Technologies, Inc., 555 Union Boulevard, Room 30L-15P-BA, Allentown, PA 18103.
"Actel ES Family Digital Phase Lock Loop Usage", by Joel Landry, Sep. 17, 1996, pp. 1-5, available from Actel Corp., 955 East Arques Avenue, Sunnyvale, California 94086.
Xilinx, Inc.; "Virtex-II Pro Platform FPGA Handbook"; published Oct. 14, 2002; pp. 49-58 and 180-201, available from Xilinx, Inc., 2100 Logic Drive, San Jose, California 95124.
U.S. Appl. No. 09/684,529, filed Oct. 6, 2000, Logue et al.
U.S. Appl. No. 09/684,540, filed Oct. 6, 2000, Young et al.

* cited by examiner

DIGITAL CLOCK MANAGER HAVING CASCADE VOLTAGE SWITCH LOGIC CLOCK PATHS

FIELD OF THE INVENTION

The present invention relates to a digital clock manager (DCM) for a programmable logic device. More specifically, the present invention relates to a DCM that implements symmetrical cascade voltage switch logic (CVSL) paths.

RELATED ART

Clock paths in conventional DCMs (digital clock managers) use single-ended CMOS circuits. These single-ended circuits introduce propagation delays to the rising and falling edges of the associated clock signals. The propagation delays introduced to the rising and falling edges by the single-ended circuits are dependent on process, voltage and temperature. Consequently, the propagation delay introduced to the rising edges of a clock signal is often different than the propagation delay introduced to the falling edges of the clock signal. The result of these different propagation delays is the widening or narrowing of the clock duty cycle (i.e., duty cycle distortion). Such duty cycle distortion can prevent the proper operation of other circuits within the DCM and/or limit the maximum performance of the DCM.

Figure 1:
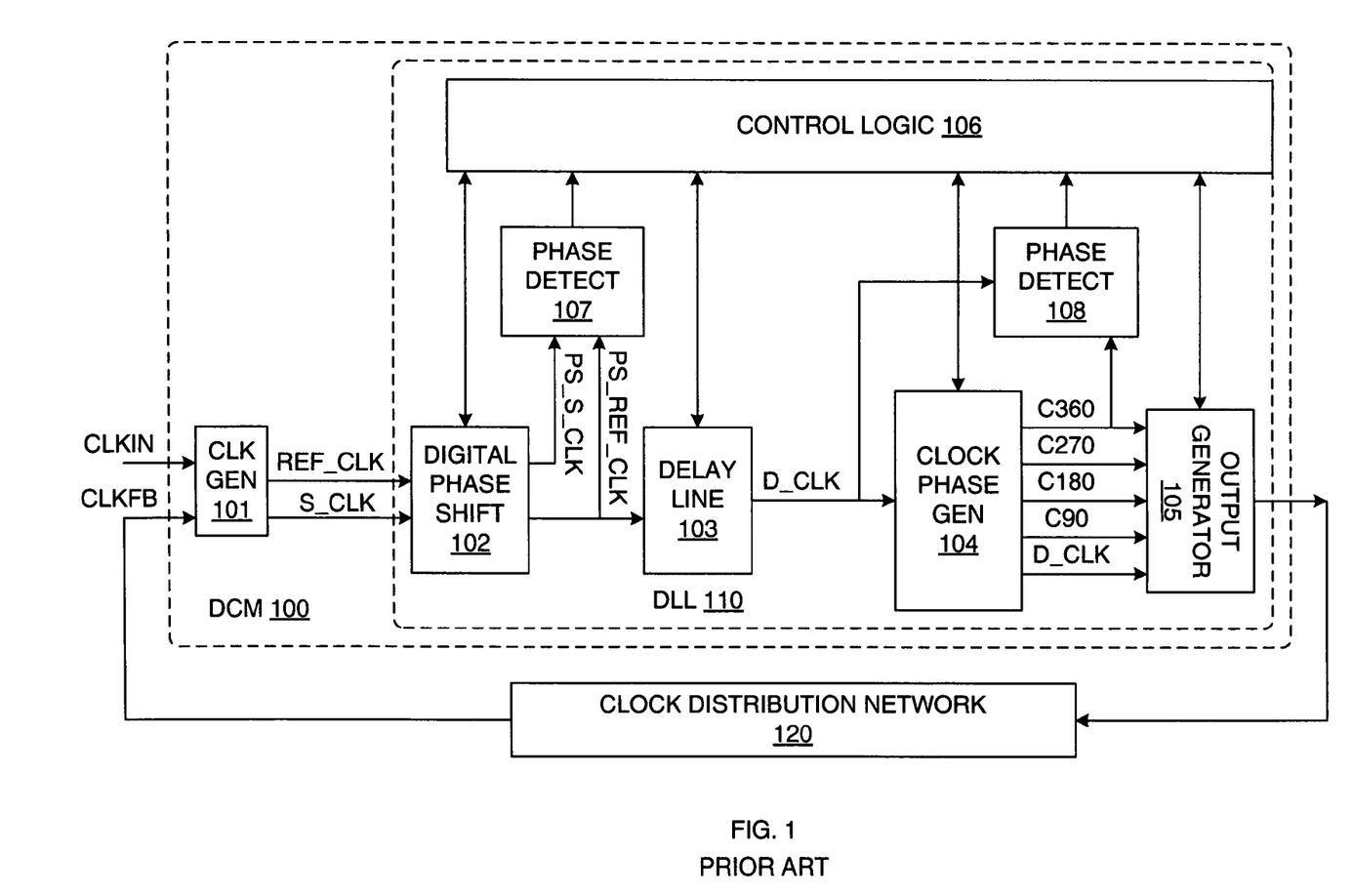
FIG. 1 is a block diagram of a conventional DCM, which can be modified to implement CVSL clock paths in accordance with one embodiment of the present invention.

FIG. 1 is a block diagram of a conventional DCM 100 in accordance with one embodiment of the present invention. DCM 100 includes clock generation circuit 101, digital phase shifter 102, delay line 103, clock phase generator 104, output generator 105, control logic 106 and phase detectors 107 and 108.

The function of DCM 100 is to add delay to the input clock CLKIN, as it propagates through the DCM and clock distribution network 120 and returns as the feedback clock signal CLKFB, until there is a desired phase relationship between the CLKIN and CLKFB signals. In general, an input clock signal CLKIN is provided to clock generator 101. In response, clock generator 101 provides a reference clock signal REF_CLK and a skew clock S_CLK to digital phase shifter 102, where the REF_CLK signal is derived from the CLKIN signal, and the S_CLK signal is derived from the CLKFB signal. In response, digital phase shifter 102 provides a phase shifted reference clock PS_REF_CLK and a phase shifted skew clock PS_S_CLK to phase detector 107. The amount of phase shift applied to PS_REF_CLK and PS_S_CLK may be identical or different. In response, phase detector 107 provides a control signal to control logic 106 that is representative of the phase difference between these two signals. Control logic introduces delay to the PS_REF_CLK signal until a desired phase relationship exists between these clock signals. This delay is introduced by delay line 103.

The PS_REF_CLK signal is provided to delay line 103, which introduces a signal delay to the PS_REF_CLK to create the delayed clock signal D_CLK. Control logic 106 typically controls the delay introduced to the PS_REF_CLK signal, such that the REF_CLK signal and the S_CLK signal are rising edge aligned at the phase detector 107.

The D_CLK signal is provided to clock phase generator 104 and phase detector 108. Clock phase shifter 104 creates four additional clock signals C90, C180, C270 and C360, which lag the D_CLK signal by 90, 180, 270 and 360 degrees, respectively. The C360 signal is provided to phase detector 108, which provides a control signal to control logic 106 that is representative of the phase difference between the D_CLK and C360 signals. Control logic 106 adjusts the delay of clock phase generator 104 such that the D_CLK signal is synchronized with the C360 signal.

Control logic 106 also causes output generator 105 to provide one or more output clock signals in response to the D_CLK, C90, C180, C270 and C360 signals.

The single-ended clock signal paths in DCM 100 therefore extend through clock generation circuit 101, digital phase shifter 102, delay line 103, clock phase generator 104 and output generator 105. These clock signal paths are constructed using single-ended CMOS circuits.

For example, the clock signal paths through clock generation circuit 101 typically include single-ended circuit elements such as basic buffers, 2:1 multiplexers, 4:1 multiplexers, 2-input AND gates and 2-input OR gates. One example of clock generation circuit 101 is described in U.S. patent application Ser. No. 09/684,529, entitled "Synchronized Multi-Output Digital Clock Manager" by Logue et al., which is incorporated by reference.

The clock signal paths through digital phase shifter 102, delay line 103 and clock phase generator 104 typically include single-ended circuit elements such as basic buffers, 2:1 multiplexers, 3:1 multiplexers and 4:1 multiplexers. One example of digital phase shifter 102, delay line 103 and clock phase generator 104 is described in U.S. patent application Ser. No. 09/684,540, entitled "Digital Phase Shifter" by Young et al., which is incorporated by reference.

The clock signal paths through output generator 105 typically include single-ended circuit elements such as basic buffers, 2:1 multiplexers, 4:1 multiplexers, 2-input AND gates, 2-input OR gates and 3-input set-reset (S–R) latches. One example of output generator 105 is described in U.S. patent application Ser. No. 09/684,540, which is hereby incorporated by reference.

It would therefore be desirable to have clock paths through a DCM that preserve the duty cycle of input clock signals, with no duty cycle distortion. It would further be desirable for these clock paths to preserve duty cycle independently of process, voltage, and temperature variations.

SUMMARY

Accordingly, the present invention provides a digital clock manager that implements differential clock signal paths using symmetrical cascade voltage switch logic (CVSL) circuit elements. The differential clock signal paths are provided by replacing single-ended circuit elements of a conventional digital clock manager with equivalent CVSL circuit elements. Thus, the present invention implements CVSL buffers, CVSL multiplexers, CVSL AND gates, CVSL OR gates and CVSL set-reset latches, all of which are symmetrical and which replace similar single-ended circuit elements in clock generation circuit 101, digital phase shifter 102, delay line 103, clock phase generator 104 and output generator 105 (FIG. 1). These CVSL AND gates, CVSL OR gates and CVSL set-reset latches represent new circuit elements.

In accordance with the present invention, logic transitions ("1" to "0" and "0" to "1") are represented by differential CVSL signals. Because of the symmetrical nature of the associated CVSL circuits, the differential signal transitions for both logic transitions are identical. Therefore, propagation delays of both logic transitions are identical, which results in no distortion of the input duty cycle.

In accordance with one embodiment, a digital clock manager includes a delay line that includes a plurality of series-connected cascade voltage switch logic (CVSL) buffers coupled to receive an input differential clock signal, and a CVSL multiplexer circuit coupled to receive delayed differential clock signals from the output terminals of the series-connected CVSL buffers. The CVSL multiplexer circuit is controlled to route one of the delayed differential clock signals as an output signal.

In accordance with another embodiment, the digital clock manager includes one or more CVSL combinational logic gates. These CVSL combinational logic gates can implement, for example, logic AND functions and logic OR functions.

In one embodiment, each CVSL combinational logic gate includes a first pair of differential input nodes adapted to receive a first differential clock signal, a second pair of differential input nodes adapted to receive a second differential clock signal, combinational logic adapted to perform a logical function in response to the first and second differential clock signals, and in response, provide a differential output clock signal, and a pair of differential output nodes coupled to receive the differential output clock signal from the combinational logic.

In accordance with another embodiment, the digital clock manager includes a set-reset latch that includes a pair of differential output nodes including a first output node and a second output node. A first inverter has an input terminal coupled to the first output node and an output terminal coupled to the second output node. A second inverter has an input terminal coupled to the second output node and an output terminal coupled to the first output node, such that the first and second inverters form a cross-coupled latch. A first set of one or more transistors is provided, each having a drain coupled to the first output node, a source coupled to a first control node, and a gate coupled to receive an associated one or more reset control signal. A second set of one or more transistors is also provided, each having a drain coupled to the second output node, a source coupled to the first control node, and a gate coupled to receive an associated one or more set control signal. A first control transistor has a drain coupled to the first control node and a source coupled to a ground supply terminal. A second control transistor has a drain coupled to the first output node and a source coupled to the ground supply terminal.

The set-reset latch is initially reset to a logic "0" value by a reset control circuit. When one of the set control signals is asserted, the set-reset latch is set to a logic "1" value. When one of the reset control signals is asserted, the set-reset latch is reset to a logic "0" value.

The present invention will be more fully understood in view of the following description and drawings.

DETAILED DESCRIPTION

In accordance with the present invention, the clock signal paths through a digital clock manager (DCM) implement symmetrical cascade voltage switch logic (CVSL) circuit elements in order to route the associated clock signals. That is, clock signals within the DCM are transmitted on CVSL clock paths, instead of single-ended CMOS clock paths. In accordance with one embodiment, the DCM 100 of FIG. 1 is modified to replace the single-ended circuit elements with CVSL circuit elements. In order to accomplish this modification, CVSL circuit elements must be provided to implement a basic buffer, an N:1 multiplexer (e.g., N=2, 3 or 4), a 2-input AND gate, a 2-input OR gate, and a 3-input S-R latch. These CVSL circuit elements are used to replace the corresponding single-ended circuit elements in clock generation circuit 101, digital phase shifter 102, delay line 103, clock phase generator 104 and output generator 105. The clock signal paths in DCM 100 are also modified to carry differential clock signals. In accordance with another embodiment, the CVSL circuit elements are used to replace single-ended circuit elements in the clock paths of other types of DCMS.

The CVSL circuit elements used in accordance with the present invention are described below.

Figure 2:
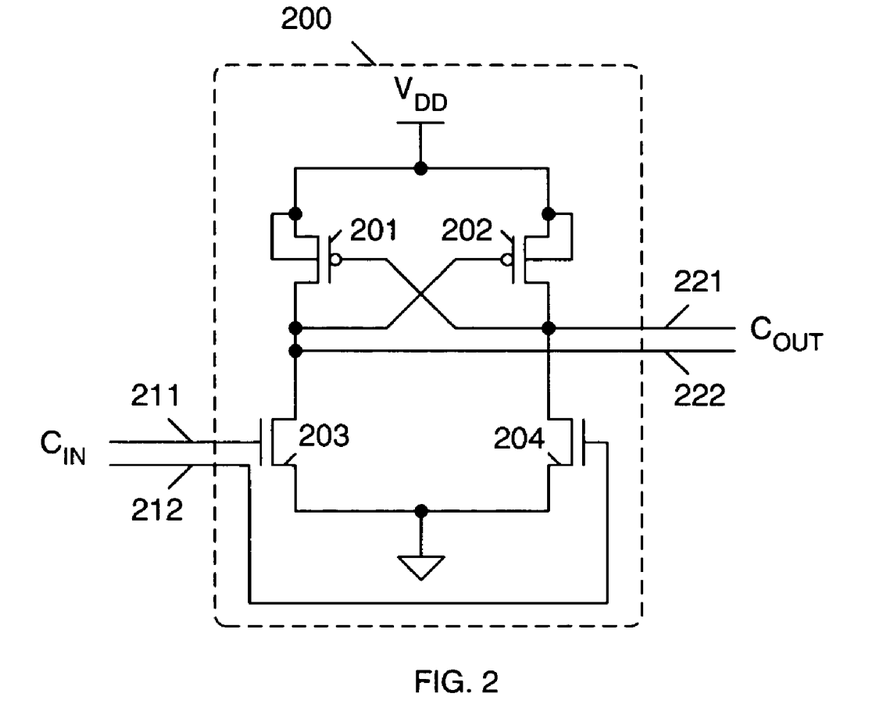
FIG. 2 is circuit diagram of a CVSL buffer, which is used as a clock delay element in accordance with one embodiment of the present invention.

FIG. 2 is circuit diagram of a CVSL buffer 200 in accordance with one embodiment of the present invention. CVSL buffer 200 can be used in delay lines to introduce delay to the various differential clock signals in DCM 100. For example, CVSL buffer 200 may introduce a delay on the order of about 100 picoseconds.

Buffer 200 includes p-channel transistors 201–202 and n-channel transistors 203–204, which are coupled as a differential buffer circuit (e.g., a differential cascode voltage switch logic (DCVSL) circuit). More specifically, the sources and bulk regions of p-channel transistors 201 and 202 are coupled to the $V_{DD}$ supply voltage terminal, the gate of p-channel transistor 201 is coupled to the drain of p-channel transistor 202, and the gate of p-channel transistor 202 is coupled to the drain of p-channel transistor 201. The sources of n-channel transistors 203 and 204 are coupled to the ground voltage supply terminal. The gates of n-channel transistors 203 and 204 are coupled to receive a differential clock signal CIN, on input nodes 211 and 212. The drains of n-channel transistors 203 and 204 are coupled to the drains of p-channel transistors 201 and 202, respectively. The drains of p-channel transistors 201 and 202 are also coupled to output nodes 221 and 222, respectively.

A differential clock signal $C_{OUT}$ is provided on output nodes 221–222 in response to the $C_{IN}$ signal. Buffer 200 introduces a first delay to the differential clock signal $C_{IN}$, such that the differential clock signal $C_{OUT}$ is delayed with respect to the $C_{IN}$ signal.

In accordance with one embodiment, the layout of buffer 200 is symmetrical. Thus, n-channel transistors 203–204 are identical in size, and p-channel transistors 201–202 are identical in size, to maintain symmetry of the inputs relative to the outputs. In this embodiment, output nodes 221 and 222 are identical, and input nodes 211 and 212 are identical. Buffer 200 is designed to minimize the parasitic capacitance of output nodes 221–222. In addition, buffer 200 is designed such that the parasitic resistance between p-channel transistors 201–202 and n-channel transistors 203–204 is minimized.

For functionality, in some embodiments the effective Wp/Wn ratio is less than or equal to 1/0.8, wherein Wp is the width of p-channel transistor 201 (or 202), and Wn is the width of n-channel transistor 203 (or 204). Selecting the Wp/Wn ratio in this manner may compensate for worst-case operating conditions (e.g., a slow-fast (SF) process corner, −55° C., 0.75 Volt). If buffer 200 is used as a level-shifting buffer (instead of a delay buffer), then the Wp/Wn ratio may be selected to be about 1/2.5. This is necessary because a level-shifting buffer converts an input signal at one voltage level to an output signal at another, higher voltage level. The difference in these two voltage levels may require a wider ratio. In a particular embodiment, each of p-channel transistors 201–202 has a width-to-length ratio of 6.0/0.09, and each of n-channel transistors 203–204 has a width-to-length ratio of 6.7/0.09. As a result, the Wp/Wn ratio is equal to 6.0/6.7, or about 1/1.12. Note that in the described embodiment, n-channel transistors 203–204 are not low threshold voltage transistors, thereby minimizing leakage currents in buffer 200.

Buffers similar or identical to buffer 200 may be used to transmit clock signals along the clock signal paths of DCM 100 (FIG. 1). Buffers identical to buffer 200 can be used in tap delay lines or trim delay lines, as described in more detail in commonly owned, co-pending U.S. patent application entitled "Digital Clock Manager Capacitive Trim Unit" by Morrison et al., filed on the date hereof.

Figure 3:
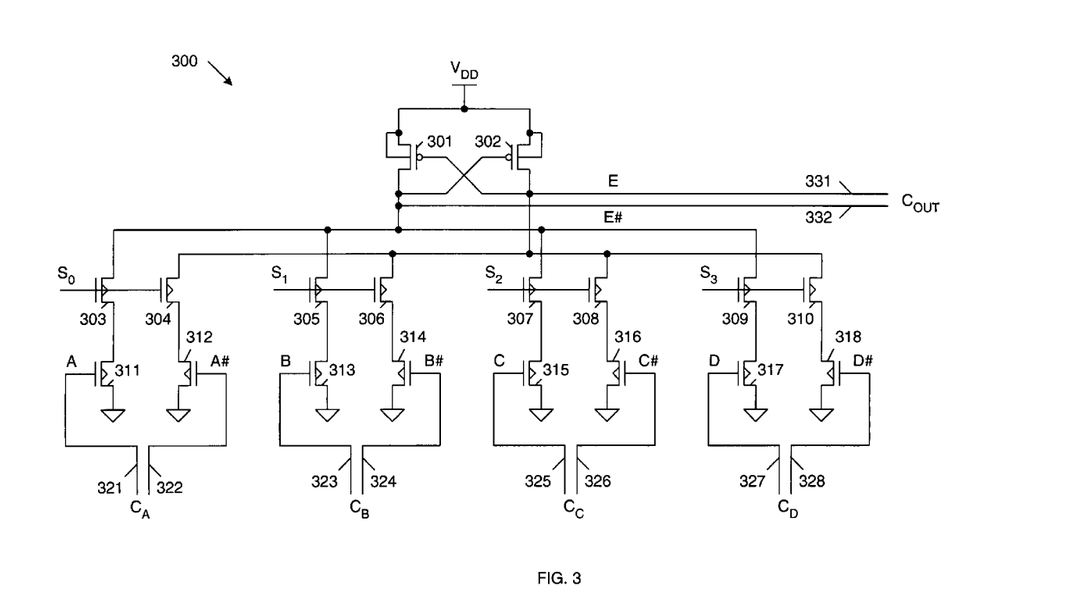
FIG. 3 is a circuit diagram of a 4:1 CVSL multiplexer, which is used along a clock path of a DCM in accordance with another embodiment of the present invention.

FIG. 3 is a circuit diagram of a CVSL 4:1 multiplexer 300 in accordance with another embodiment of the present invention. CVSL multiplexer 300 includes p-channel transistors 301–302 and low voltage threshold (LVT) n-channel transistors 303–318. LVT transistors 303–318 may have a lower threshold voltage than n-channel transistors 203–204. For example, LVT transistors 303–318 may have a threshold voltage of about 300 mV, while n-channel transistors 203–204 have a threshold voltage of about 400 mV. In the present description, LVT transistors are illustrated with a "V" in the channel region.

The source and bulk regions of p-channel transistors 301 and 302 are coupled to the $V_{DD}$ supply voltage terminal, the gate of p-channel transistor 301 is coupled to the drain of p-channel transistor 302, and the gate of p-channel transistor 302 is coupled to the drain of p-channel transistor 301. The drains of p-channel transistors 301 and 302 are also coupled to output terminals 331–332, which carry output values E and E# respectively, as the output clock signal $C_{OUT}$.

The sources of n-channel LVT transistors 311–318 are coupled to the ground supply terminal. The drains of transistors 311–318 are coupled to sources of n-channel LVT transistors 303–310, respectively. The drains of transistors 303, 305, 307 and 309 are coupled to output node 332, and the drains of transistors 304, 306, 308 and 310 are coupled to output node 331. The gates of transistors 311–318 are coupled to input terminals 321–328, respectively. Differential input clock signals $C_A$, $C_B$, $C_C$ and $C_D$ are applied to input terminal pairs 321–322, 323–324, 325–326 and 327–328, respectively. Multiplexer select signals $S_0$, $S_1$, $S_2$ and $S_3$ are applied to the gates of transistor pairs 303–304, 305–306, 307–308 and 309–310, respectively.

Multiplexer 300 operates as follows. One of the select signals $S_0$–$S_3$ is activated high, and the other three select signals are deactivated low. For example, select signal $S_0$ may be activated high, while select signals $S_1$–$S_3$ are deactivated low. In this example, transistors 303 and 304 are turned on, and transistors 305–310 are turned off. As a result, clock signals $C_B$, $C_C$ and $C_D$ are isolated from output nodes 331–332. However, when the $C_A$ signal has a logic "1" state, transistor 311 is turned on, such that output node 332 is pulled down toward ground. As a result, p-channel transistor 302 is turned on, causing output node 331 to be pulled up toward the $V_{DD}$ supply voltage. Thus, the $C_{OUT}$ signal has a logic "1" state at this time. Conversely, when the $C_A$ signal has a logic "0" state, transistor 312 is turned on, such that output node 331 is pulled down toward ground. As a result, p-channel transistor 301 is turned on, causing output node 332 to be pulled up toward the $V_{DD}$ supply voltage. Thus, the $C_{OUT}$ signal has a logic "0" state at this time. In this manner, the selected clock signal $C_A$ is routed as the output clock signal $C_{OUT}$.

Although CVSL multiplexer 300 is described as a 4:1 multiplexer, it is understood that this structure can be easily modified to implement 2:1 multiplexers, 3:1 multiplexers, or multiplexers of other sizes. These CVSL multiplexers are used to replace single-ended multiplexers in the clock paths of DCM 100, for example in clock generator 101, digital phase shifter 102, delay line 103, clock phase generator 104 and output generator 105, in accordance with one embodiment of the present invention.

The layout of CVSL multiplexer 300 is symmetrical, wherein the input LVT n-channel transistors 311–318 are identical in size, the select LVT n-channel transistors 303–310 are identical in size, and p-channel transistors 301–302 are identical in size. The sizes of the input LVT transistors 311–318 may be different from or identical to the size of the select LVT transistors 303–310. In addition, input nodes 321–328 are identical, and output nodes 331–332 are identical. The parasitic capacitance of output terminals 331 and 332 is minimized. The parasitic resistance between the n-channel transistors 303–318 and the p-channel transistors 301–302 is minimized.

For improved functionality in a particular process technology, the effective Wp/Wnlvt ratio should be less than or equal to 2, wherein Wp is the width of p-channel transistors 301–302, and Wnlvt is the width of n-channel LVT transistors 303–318. Selecting the Wp/Wnlvt ratio in this manner ensures that CVSL multiplexer 300 operates properly under worst-case conditions (e.g., SF process corner, −55° C., 0.75 Volts). In a particular embodiment, each of p-channel transistors 301–302 has a width-to-length ratio of 3.0/0.08, and each of n-channel LVT transistors 303–318 has a width-to-length ratio of 3.0/0.08. As a result, the effective Wp/Wnlvt ratio is equal to 3.0/1.5, or 2/1.

In an alternate embodiment, the LVT n-channel transistors 303–318 can be replaced with regular n-channel transistors. In another variation, the LVT n-channel transistors 311–318 can be "on top" of select LVT n-channel transistors 303–310. That is, transistors 311–318 can swap positions with transistors 303–310.

Figure 4:
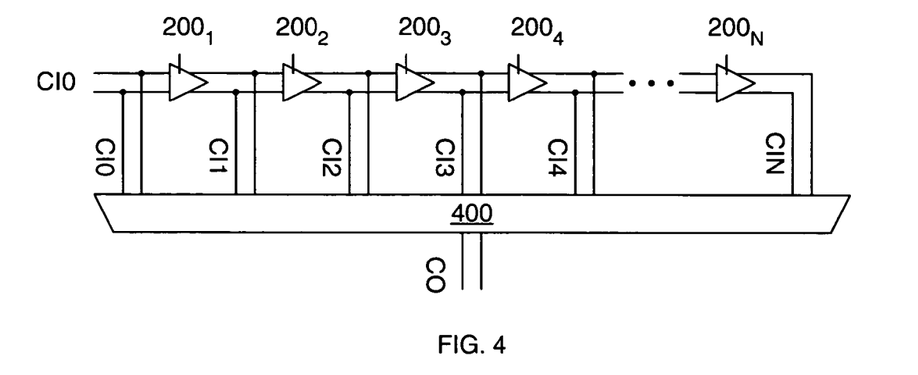
FIG. 4 is a block diagram of a series connected chain of CVSL buffers and a CVSL multiplexer in accordance with one embodiment of the present invention.

FIG. 4 is a block diagram of a series-connected chain of CVSL buffers $200_1$–$200_N$ and a CVSL multiplexer 400 in accordance with one embodiment of the present invention. Each of CVSL buffers $200_1$–$200_N$ is identical to CVSL buffer 200 (FIG. 2), and CVSL multiplexer 700 has a structure based on CVSL multiplexer 300 (FIG. 3). The circuit structure of FIG. 4 is used extensively in the DCM of the present invention. A differential input clock signal CI0 is applied to CVSL buffer $200_1$ and multiplexer 400. In response, CVSL buffer $200_1$ introduces a delay to the CI0 signal, thereby providing delayed differential clock signal CI1 to CVSL buffer $200_2$ and multiplexer 400. In a similar manner, series-connected CVSL buffers $200_2$–$200_N$ provide delayed differential clock signals CI2–CIN, respectively. In response to a control signal(s) (not shown), CVSL multiplexer 400 routes one of the differential clock signals CI0–CIN as a delayed differential output clock signal CO.

Figure 5:
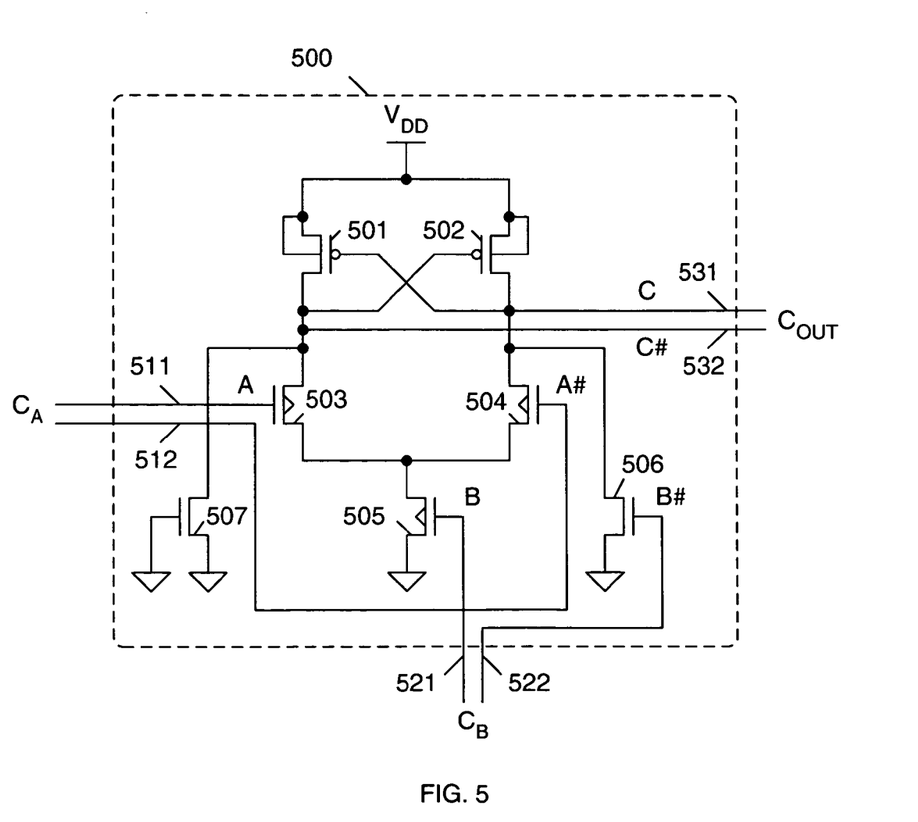
FIG. 5 is a circuit diagram of a 2-input CVSL AND gate in accordance with another embodiment of the present invention.

FIG. 5 is a circuit diagram of a 2-input CVSL AND gate 500 in accordance with another embodiment of the present invention. AND gate 500 can be used to handle various logic operations, for example in clock generator 101 and output generator 105 of DCM 100. AND gate 500 includes p-channel transistors 501–502, LVT n-channel transistors 503–505 and n-channel transistors 506–507. LVT transistors 503–505 have a lower threshold voltage than n-channel transistors 506–507. For example, LVT transistors 503–505 may have a threshold voltage of 300 mV, while n-channel transistors 506–507 have a threshold voltage of 400 mV. As described below, LVT transistors 503–505 and n-channel transistor 506 operate in response to differential clock signals.

The source and bulk regions of p-channel transistors 501 and 502 are coupled to the $V_{DD}$ supply voltage terminal, the gate of p-channel transistor 501 is coupled to the drain of p-channel transistor 502, and the gate of p-channel transistor 502 is coupled to the drain of p-channel transistor 501. The sources of LVT n-channel transistors 503 and 504 are coupled to the drain of LVT n-channel transistor 505. The gates of LVT n-channel transistors 503 and 504 are coupled to receive a differential clock signal $C_A$, on input nodes 511 and 512. The drains of LVT n-channel transistors 503 and 504 are coupled to the drains of p-channel transistors 501 and 502, respectively. The drains of p-channel transistors 501 and 502 are also coupled to output nodes 532 and 531, respectively, to provide differential output $C_{OUT}$.

The drain of n-channel transistor 506 is coupled to output node 531. The sources of LVT n-channel transistor 505 and n-channel transistor 506 are coupled to the ground supply terminal. The gates of LVT n-channel transistor 505 and n-channel transistor 506 are coupled to receive a differential input clock signal $C_B$ on input nodes 521 and 522, respectively.

The drain of n-channel transistor 507 is coupled to output node 532. The source and gate of n-channel transistor 507 are coupled to the ground supply terminal. Transistor 507 creates symmetry within the circuit. That is, transistor 507 balances out transistor 506 by providing a load on node C# equal to the load on node C created by transistor 506.

AND gate 500 operates as follows. The differential signal $C_A$ includes a pair of complementary signals A and A#, which are applied to the gates of LVT transistors 503 and 504, respectively. When signal A has a larger value than signal A#, signal $C_A$ is said to have a logic "1" value. Conversely, when signal A# has a larger value than signal A, signal $C_A$ is said to have a logic "0" value.

Similarly, the differential signal $C_B$ includes a pair of complementary signals B and B#, which are applied to LVT transistors 505 and 506, respectively. When signal B has a larger value than signal B#, signal $C_B$ is said to have a logic "1" value. Conversely, when signal B# has a larger value than signal B, signal $C_B$ is said to have a logic "0" value.

When both the $C_A$ and $C_B$ signals have a logic "1" value, LVT transistors 503 and 505 are turned on, and LVT transistor 504 and regular transistor 506 are turned off. Under these conditions, the C# signal on output node 532 is pulled down toward the ground supply voltage. As a result, p-channel transistor 502 is turned on, thereby pulling the C signal on output node 531 up toward the $V_{DD}$ supply voltage. Thus, when both the $C_A$ and $C_B$ signals have a logic "1" value, the $C_{out}$ signal also has a logic "1" value.

If the $C_A$ signal has a logic "0" value, LVT transistor 504 is turned on, and either transistor 505 or 506 is turned on in response to the $C_B$ signal. As a result, the C signal on output node 531 is pulled down toward the ground supply voltage. As a result, p-channel transistor 501 is turned on, thereby pulling the C# signal on output node 532 up toward the $V_{DD}$ supply voltage. Thus, when the $C_A$ signal has a logic "0" value, the $C_{out}$ signal also has a logic "0" value.

If the $C_B$ signal has a logic "0" value, transistor 506 is turned on. As a result, the C signal on output node 531 is pulled down toward the ground supply voltage. As a result, p-channel transistor 501 is turned on, thereby pulling the C# signal on output node 532 up toward the $V_{DD}$ supply voltage. Thus, when the $C_B$ signal has a logic "0" value, the $C_{out}$ signal also has a logic "0" value.

In the foregoing manner, AND gate 500 performs a logical AND operation on the $C_A$ and $C_B$ signals, thereby providing the $C_{out}$ signal.

The layout of AND gate 500 is symmetrical, such that the LVT n-channel transistors 503–504 have identical sizes, the n-channel transistors 506–507 have identical sizes, and the p-channel transistors 501–502 have identical sizes. In addition, input nodes 511 and 512 are identical, input nodes 521 and 522 are identical, and output nodes 531 and 532 are identical. The parasitic capacitance on output terminals 531 and 532 is minimized. In addition, the parasitic resistance between the n-channel transistors 503–507 and the p-channel transistors 501–502 is minimized.

For functionality in a particular process technology, the effective Wp/Wnlvt ratio should be less than or equal to 2, wherein Wnlvt represents the width of the LVT transistors 503–505. In addition, the Wp/Wn ratio should be less than or equal to 1.25. For a particular process technology, these ratios allow for proper operation under worst-case conditions (e.g., SF process corner, −55° C., 0.75 Volts). In a particular embodiment, each of p-channel transistors 501–502 may have a width-to-length ratio of 2.9/0.09, and each of n-channel transistors 503–507 may have a width-to-length ratio of 3.5/0.09. As a result, the effective Wp/Wnlvt ratio is 2.9/1.75 and the Wp/Wn ratio is 2.9/3.5.

If AND gate 500 is used to transmit a clock signal, the $C_B$ signal should be set to a logic "1" state, and the clock signal to be transmitted should be applied to input terminals 511–512 as the $C_A$ signal. This configuration is used because the input nodes 511–512 are symmetrical with respect to the output terminals 531–532.

Figure 6:
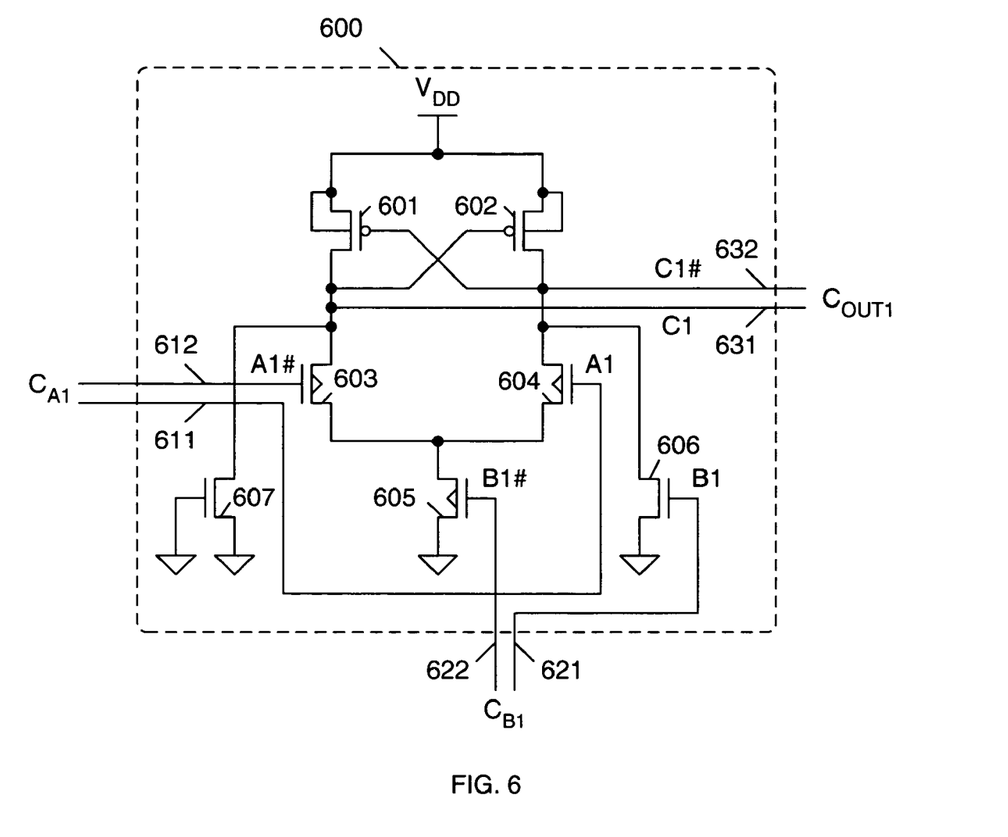
FIG. 6 is a circuit diagram of a 2-input CVSL OR gate in accordance with another embodiment of the present invention.

FIG. 6 is a circuit diagram of a 2-input CVSL OR gate 600 in accordance with another embodiment of the present invention. OR gate 600 can be used to handle various logic operations, for example in clock generator 101 and output generator 105 of DCM 100. OR gate 600 includes p-channel transistors 601–602, low voltage threshold (LVT) n-channel transistors 603–605 and n-channel transistors 606–607. P-channel transistors 601–602 and n-channel transistors 603–607 are connected in the same manner as p-channel transistors 501–502 and n-channel transistors 503–507 of AND gate 500 (FIG. 5). However, as described in more detail below, the input signals $C_{A1}$ and $C_{B1}$ are applied to OR gate 600 in a different manner, and output clock signal $C_{OUT1}$ is provided from OR gate 600 in a different manner.

OR gate 600 operates as follows in accordance with one embodiment of the present invention. The differential signal $C_{A1}$ includes a pair of complementary signals A1 and A1#, which are applied to the gates of LVT transistors 604 and 603, respectively, on input nodes 611 and 612, respectively. When signal A1 has a larger value than signal A1#, signal $C_{A1}$ is said to have a logic "1" value. Conversely, when signal A1# has a larger value than signal A1, signal $C_{A1}$ is said to have a logic "0" value.

Similarly, the differential signal $C_{B1}$ includes a pair of complementary signals B1 and B1#, which are applied to n-channel transistors 606 and LVT transistor 605, respectively, on input nodes 621 and 622, respectively. When signal B1 has a larger value than signal B#, signal $C_{B1}$ is said to have a logic "1" value. Conversely, when signal B1# has a larger value than signal B1, signal $C_{B1}$ is said to have a logic "0" value.

If the $C_{B1}$ signal has a logic "1" value, n-channel transistor 606 is turned on, and LVT transistor 605 is turned off. Under these conditions, turned on transistor 606 pulls the C1# signal on output node 632 down toward the ground supply voltage. As a result, p-channel transistor 601 is turned on, thereby pulling the C1 signal on output node 631 up toward the $V_{DD}$ supply voltage. Thus, when the $C_{B1}$ signal has a logic "1" value, the $C_{OUT1}$ signal has a logic "1" value.

If the $C_{A1}$ signal has a logic "1" value and the $C_{B1}$ signal has a logic "0" value, LVT transistors 604 and 605 are turned on, and LVT transistor 603 and n-channel 606 are turned off. Under these conditions, turned on transistors 604 and 605 pull the C1# signal on output node 632 down toward the ground supply voltage. As a result, p-channel transistor 601 is turned on, thereby pulling the C1 signal on output node 631 up toward the $V_{DD}$ supply voltage. Thus, when the $C_{A1}$ signal has a logic "1" value and the $C_{B1}$ signal has a logic "0" value, the $C_{OUT1}$ signal has a logic "1" value.

If both the $C_{A1}$ and $C_{B1}$ signals have a logic "0" value, the LVT transistors 603 and 605 are turned on, and LVT transistor 604 and n-channel transistor 606 are turned off. Under these conditions, turned on transistors 603 and 605 pull the C1 signal on output node 631 down toward the ground supply voltage. As a result, p-channel transistor 602 is turned on, thereby pulling the C1# signal on output node 632 up toward the $V_{DD}$ supply voltage. Thus, when the $C_{A1}$ and $C_{B1}$ signals have logic "0" values, the $C_{OUT1}$ signal has a logic "0" value.

In the foregoing manner, OR gate 600 performs a logical OR operation on the $C_{A1}$ and $C_{B1}$ signals, thereby providing the $C_{OUT1}$ signal.

The layout of OR gate 600 is symmetrical, such that LVT n-channel transistors 603–604 have identical sizes, n-channel transistors 506–507 have identical sizes, and p-channel transistors 501–502 have identical sizes. In addition, input nodes 611 and 612 are identical, input nodes 621 and 622 are identical, and output nodes 631 and 632 are identical. The parasitic capacitance on output terminals 631 and 632 is minimized. In addition, the parasitic resistance between the n-channel transistors 603–607 and the p-channel transistors 601–602 is minimized.

For functionality in a particular process technology, the effective Wp/Wnlvt ratio should be less than or equal to 2, wherein Wnlvt represents the width of the LVT transistors 603–605. In addition, the Wp/Wn ratio should be less than or equal to 1.25. These ratios allow for proper operation under worst-case conditions (e.g., SF process corner, −55° C., 0.75 Volts). In a particular embodiment, each of p-channel transistors 601–602 has a width-to-length ratio of 2.9/0.09, and each of n-channel transistors 603–607 has a width-to-length ratio of 3.5/0.09. As a result, the effective Wp/Wnlvt ratio is 2.9/1.75 and Wp/Wn ratio is 2.9/3.5.

If OR gate 600 is used to transmit a clock signal, the $C_{B1}$ signal should be set to a logic "0" state, and the clock signal to be transmitted should be applied to input terminals 611–612 as the $C_{A1}$ signal. This configuration is used because the input nodes 611–612 are symmetrical with respect to the output terminals 631–632.

Figure 7:
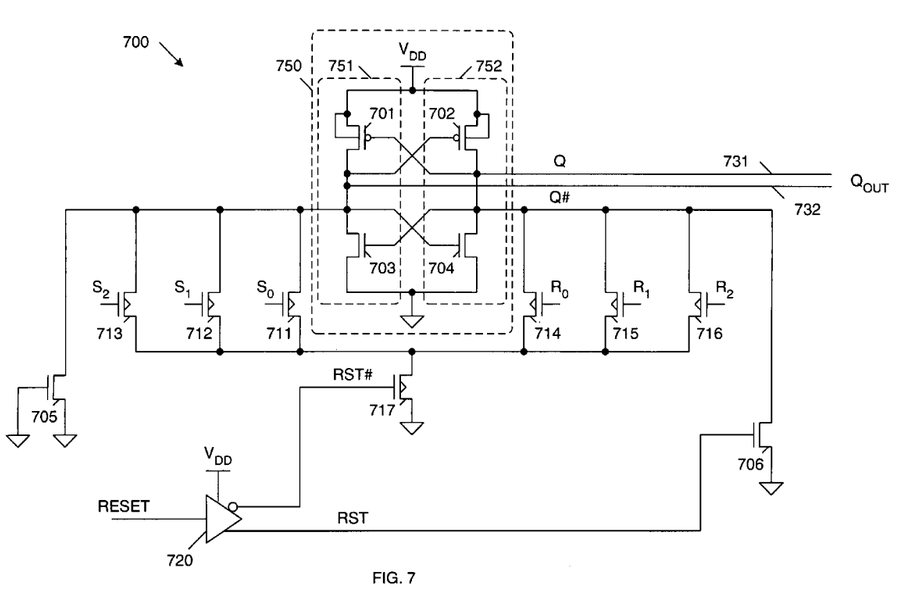
FIG. 7 is a circuit diagram of a 3-input set-reset (S-R) CVSL latch in accordance with another embodiment of the present invention.

FIG. 7 is a circuit diagram of a 3-input CVSL set-reset (S-R) latch 700 in accordance with one embodiment of the present invention. CVSL S-R latch 700 includes p-channel transistors 701–702, n-channel transistors 703–706, low threshold voltage n-channel transistors 711–717, and differential buffer 720.

The source and bulk regions of p-channel transistors 701 and 702 are coupled to the $V_{DD}$ supply voltage terminal, the gate of p-channel transistor 701 is coupled to the drain of p-channel transistor 702, and the gate of p-channel transistor 702 is coupled to the drain of p-channel transistor 701. The drains of p-channel transistors 701 and 702 are also coupled to output terminals 731 and 732, respectively, which carry differential output values Q and Q#, respectively, as the output signal $Q_{OUT}$.

The drains n-channel transistors 703 and 704 are coupled to output terminals 732 and 731, respectively, and the gates of n-channel transistors 703 and 704 are coupled to output terminals 731 and 732, respectively. The sources of n-channel transistors 703 and 704 are coupled to ground.

Thus, transistors 701 and 703 are configured to implement a first inverter 751, and transistors 702 and 704 are configured to implement a second inverter 752. These inverters 751–752 are cross-coupled to form a storage latch 750.

The drains of n-channel transistor 705 and n-channel LVT transistors 711–713 are coupled to output node 732, and the drains of n-channel transistor 706 and n-channel LVT transistors 714–716 are coupled to output node 731. The gate of transistor 705 and the sources of transistors 705 and 706 are coupled to the ground supply terminal. The sources of transistors 711–716 are coupled to the drain of transistor 717. The source of transistor 717 is coupled to the ground supply terminal. Differential buffer 720 is coupled to receive a RESET signal, and in response, provide a reset signal RST to the gate of transistor 706, and a complementary reset signal RST# to the gate of transistor 717. The RST and RST# signals exhibit a full signal swing between the $V_{DD}$ and ground supply voltages.

The gates of transistors 711, 712 and 713 are coupled to receive set input signals $S_0$, $S_1$ and $S_2$, respectively. Similarly, the gates of transistors 714, 715 and 716 are coupled to receive reset input signals $R_0$, $R_1$ and $R_2$, respectively.

CVSL S-R latch 700 operates as follows in accordance with one embodiment of the present invention. Latch 700 is initially reset in response to a RESET signal having a logic "1" value, which causes differential buffer to provide a RST signal having a logic "1" value and a RST# signal having a logic "0" value. The logic "1" RST signal turns on n-channel transistor 706, thereby pulling output node 731 down toward the ground supply voltage and turning on p-channel transistor 701. In response, p-channel transistor 701 turns on, thereby pulling output node 732 up toward the $V_{DD}$ supply voltage. In response, n-channel transistor 704 turns on, thereby helping pull output node 731 toward the ground supply voltage. As a result, the Q signal has a logic low state and the Q# signal has a logic high state (i.e., $Q_{OUT}$ is equal to a logic "0").

After this reset operation is complete, the RESET signal transitions to a logic "0" state, thereby causing the RST signal to go low, and the RST# signal to go high. Under these conditions transistor 706 is turned off, and transistor 717 is turned on, thereby coupling the sources of transistors 711–716 to ground. Transistor 705 creates symmetry within the circuit. That is, transistor 705 balances out transistor 706 by providing a load on node Q# equal to the load on node Q created by transistor 706. Note that the logic "0" value of $Q_{OUT}$ remains latched in transistors 701–704.

If any one of the set signals $S_0$–$S_2$ is activated to a logic "1" state, then the associated transistor 711–713 is turned on, and output node 732 is pulled down toward the ground supply voltage. Under these conditions, p-channel transistor 702 is turned on, thereby pulling the voltage on output node 731 up toward the $V_{DD}$ supply voltage. This high voltage on output node 731 causes n-channel transistor 703 to turn on, such that this transistor 703 also pulls down the voltage on output node 732 toward the ground supply voltage. As a result, the Q signal has a logic high state and the Q# signal has a logic low state (i.e., $Q_{OUT}$ is set to a logic "1" state).

If any one of the reset signals $R_0$–$R_2$ is activated to a logic "1" state, then the associated transistor 714–716 is turned on, and output node 731 is pulled down toward the ground supply voltage. Under these conditions, p-channel transistor 701 is turned on, thereby pulling the voltage on output node 732 up toward the $V_{DD}$ supply voltage. This high voltage on output node 732 causes n-channel transistor 704 to turn on, such that this transistor 704 also pulls the voltage on output node 731 down toward the ground supply voltage. As a result, the Q signal has a logic low state and the Q# signal has a logic high state (i.e., $Q_{OUT}$ is reset to a logic "0" state).

In the present embodiment, the layout of CVSL S–R latch 700 is symmetrical, such that LVT n-channel transistors 711–716 have identical sizes, n-channel transistors 705–706 have identical sizes, and p-channel transistors 701–702 have identical sizes. In addition, the input nodes that receive the $S_0$–$S_2$ and $R_0$–$R_2$ signals are identical. The parasitic capacitance on output nodes 731 and 732 is minimized, and the parasitic resistance between the n-channel transistors 703–706 and 711–717 and p-channel transistors 701–702 is minimized.

For improved functionality in a particular process technology, the effective Wp/Wn ratio should be less than or equal to 1/0.8 and the effective Wp/Wnlvt ratio should be less than or equal to 2/1. Selecting the Wp/Wn ratio and the Wp/Wnlvt ratio in this manner enables CVSL S–R latch 700 to function properly under worst-case operating conditions (e.g., SF process corner, −55° C., 0.75 Volt). In a particular embodiment, each of p-channel transistors 701–702 has a width-to-length ratio of 1.3/0.09, and each of n-channel transistors 705–706 and 711–717 has a width-to-length ratio of 1.5/0.09. As a result, the Wp/Wn ratio is 1.3/1.5 and the effective Wp/Wnlvt ratio is 1.3/0.75. Although CVSL S–R latch 700 is described as having 3 set input nodes and 3 reset input nodes, it is understood that this structure can be easily modified to implement CVSL S–R latches having other numbers of inputs. These CVSL S–R latches are used to replace single-ended S–R latches in the clock paths of output generator 105, in accordance with one embodiment of the present invention.

Although the invention has been described in connection with several embodiments, it is understood that this invention is not limited to the embodiments disclosed, but is capable of various modifications, which would be apparent to one of ordinary skill in the art. For example, although the present invention has been described with a specific DCM structure, it us understood that the CVSL clock paths can be created in other DCMs. Thus, the present invention is only intended to be limited by the following claims.

The invention claimed is:

1. A digital clock manager (DCM) comprising:

a delay line including a plurality of series-connected symmetrical cascade voltage switch logic (CVSL) buffers coupled to receive an input differential clock signal, and in response, provide a plurality of delayed differential clock signals; and a CVSL multiplexer coupled to receive the delayed differential clock signals from output terminals of the series-connected CVSL buffers;

wherein the CVSL multiplexer comprises:

a first p-channel transistor having a source coupled to a first voltage supply terminal and a drain coupled to a first differential output terminal;

a second p-channel transistor having a source coupled to the first voltage supply terminal and a drain coupled to a second differential output terminal;

wherein a gate of the first p-channel transistor is coupled to the second output terminal;

wherein a gate of the second p-channel transistor is coupled to the first output terminal;

a first n-channel transistor having a drain coupled to the first differential output terminal and a gate coupled to receive a control signal;

a second n-channel transistor having a drain coupled to the second differential output terminal and a gate coupled to receive the control signal;

a third n-channel transistor having a source coupled to a second voltage supply terminal and a drain coupled to a source of the first n-channel transistor; and a fourth n-channel transistor having a source coupled to the second voltage supply terminal and a drain coupled to a source of the second n-channel transistor, wherein differential output terminals of one of the CVSL buffers are coupled to gates of the third and fourth n-channel transistors.

2. The DCM of claim 1, wherein each of the CVSL buffers comprises:

a first p-channel transistor having a source coupled to a first voltage supply terminal and a drain coupled to a first differential output terminal;

a second p-channel transistor having a source coupled to the first voltage supply terminal and a drain coupled to a second differential output terminal;

a first n-channel transistor having a source coupled to a second voltage supply terminal and a drain coupled to the first differential output terminal;

a second n-channel transistor having a source coupled to the second voltage supply terminal and a drain coupled to the second differential output terminal;

a first differential input terminal coupled to a gate of the first n-channel transistor;

a second differential input terminal coupled to a gate of the second n-channel input transistor;

wherein a gate of the first p-channel transistor is coupled to the second output terminal; and wherein a gate of the second p-channel transistor is coupled to the first output terminal.

3. A digital clock manager (DCM) comprising:

a delay line including a plurality of series-connected symmetrical cascade voltage switch logic (CVSL) buffers coupled to receive an input differential clock signal, and in response, provide a plurality of delayed differential clock signals; and a CVSL multiplexer coupled to receive the delayed differential clock signals from output terminals of the series-connected CVSL buffers;

wherein the CVSL multiplexer comprises:

a first p-channel transistor having a source coupled to a first voltage supply terminal and a drain coupled to a first differential output terminal;

a second p-channel transistor having a source coupled to the first voltage supply terminal and a drain coupled to a second differential output terminal;

wherein a gate of the first p-channel transistor is coupled to the second output terminal;

wherein a gate of the second p-channel transistor is coupled to the first output terminal;

a first n-channel transistor having a drain coupled to the first differential output terminal;

a second n-channel transistor having a drain coupled to the second differential output terminal, wherein differential output terminals of one of the CVSL buffers are coupled to gates of the first and second n-channel transistors;

a third n-channel transistor having a source coupled to a second voltage supply terminal, a drain coupled to a source of the first n-channel transistor and a gate coupled to receive a control signal; and a fourth n-channel transistor having a source coupled to the second voltage supply terminal, a drain coupled to a source of the second n-channel transistor, and a gate coupled to receive the control signal.

4. The DCM of claim 3, wherein each of the CVSL buffers comprises:

a first p-channel transistor having a source coupled to a first voltage supply terminal and a drain coupled to a first differential output terminal;

a second p-channel transistor having a source coupled to the first voltage supply terminal and a drain coupled to a second differential output terminal;

a first n-channel transistor having a source coupled to a second voltage supply terminal and a drain coupled to the first differential output terminal;

a second n-channel transistor having a source coupled to the second voltage supply terminal and a drain coupled to the second differential output terminal;

a first differential input terminal coupled to a gate of the first n-channel transistor;

a second differential input terminal coupled to a gate of the second n-channel input transistor;

wherein a gate of the first p-channel transistor is coupled to the second output terminal; and wherein a gate of the second p-channel transistor is coupled to the first output terminal.

5. A combinational logic gate comprising:

a pair of symmetrical differential output nodes;

a first pair of identical input transistors having gates adapted to receive a first differential input signal, and drains coupled to the pair of symmetrical differential output nodes;

a second pair of identical transistors coupled to a first voltage supply and the pair of symmetrical differential output nodes;

a third pair of identical transistors coupled to a second voltage supply and the pair of symmetrical differential output nodes; and a first transistor coupled between the second voltage supply and sources of the first pair of identical input transistors, wherein a gate of the first transistor and a gate of a transistor of the third pair of identical transistors are adapted to receive a second differential input signal.

6. The combinational logic gate of claim 5, wherein the combinational logic gate implements a logical AND function.

7. The combinational logic gate of claim 5, wherein the combinational logic gate implements a logical OR function.

8. The combinational logic gate of claim 5, wherein the second pair of identical transistors comprise:

a first p-channel transistor having a source coupled to the first voltage supply and a drain coupled to a first differential output node of the pair of differential output nodes; and a second p-channel transistor having a source coupled to the first voltage supply and a drain coupled to a second differential output node of the pair of differential output nodes.

9. The combinational logic gate of claim 8, wherein;

a gate of the first p-channel transistor is coupled to the second differential output node; and a gate of the second p-channel transistor is coupled to the first differential output node.

10. The combinational logic gate of claim 5, wherein the third pair of identical transistors comprise:

a first n-channel transistor having a source coupled to the second voltage supply and a drain coupled to a first differential output node of the pair of differential output nodes; and a second n-channel transistor having a source and a gate coupled to the second voltage supply and a drain coupled to a second differential output node of the pair of differential output nodes.

11. The combinational logic gate of claim 10, wherein gates of the first n-channel transistor and the first transistor are adapted to receive the second differential input signal.

* * * * *